(12) United States Patent
Nikmanesh

(10) Patent No.: US 6,182,883 B1
(45) Date of Patent: Feb. 6, 2001

(54) METHOD AND APPARATUS FOR PRECISELY REGISTERING SOLDER PASTE IN A PRINTED CIRCUIT BOARD REPAIR OPERATION

(75) Inventor: Khalil N. Nikmanesh, Broomfield, CO (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/112,031

(22) Filed: Jul. 8, 1998

(51) Int. Cl.[7] .............................. B23K 1/08; B23K 37/06; B23K 1/00; B23K 5/00
(52) U.S. Cl. ............................ 228/33; 228/41; 228/39; 228/49.5; 29/840
(58) Field of Search .................................. 228/33, 39, 41, 228/248.1, 49.5, 47.1, 264; 29/840

(56) References Cited

U.S. PATENT DOCUMENTS

| | | | |
|---|---|---|---|
| 3,516,155 | * | 6/1970 | Smith ........................................ 29/626 |
| 3,684,151 | * | 8/1972 | Burman et al. ........................ 288/19 |
| 3,957,371 | * | 5/1976 | Rich ........................................ 355/74 |
| 4,506,820 | * | 3/1985 | Brucker .................................. 228/39 |
| 4,595,794 | * | 6/1986 | Wasserman ........................... 174/138 |
| 4,659,002 | * | 4/1987 | Wallgren et al. ........................ 228/8 |
| 4,802,276 | * | 2/1989 | Bowcutt et al. ........................ 29/739 |
| 4,961,955 | * | 10/1990 | Goldberg .............................. 427/57 |
| 4,985,107 | * | 1/1991 | Conroy et al. ........................ 156/299 |
| 5,034,802 | * | 7/1991 | Liebes, Jr. et al. ...................... 357/74 |
| 5,392,980 | * | 2/1995 | Swamy et al. ........................ 228/119 |
| 5,492,266 | * | 2/1996 | Hoebener et al. .................. 228/248.1 |
| 5,526,974 | * | 6/1996 | Gordon et al. ........................ 228/103 |
| 5,539,153 | * | 7/1996 | Schwiebert et al. .................. 174/260 |
| 5,782,399 | * | 7/1998 | Lapastora ............................... 228/41 |
| 5,796,590 | * | 8/1998 | Klein .................................... 361/774 |
| 5,834,705 | * | 11/1998 | Jonaidi ................................. 174/261 |
| 5,839,641 | * | 11/1998 | Teng ..................................... 228/41 |
| 5,868,070 | * | 2/1999 | Barlow ................................. 101/123 |
| 5,921,462 | * | 7/1999 | Gordon ................................. 228/191 |
| 5,984,166 | * | 11/1999 | Holzmann ............................. 228/254 |
| 6,026,566 | * | 2/2000 | Urban et al. .......................... 29/840 |

* cited by examiner

Primary Examiner—Patrick Ryan
Assistant Examiner—L. Edmondson
(74) Attorney, Agent, or Firm—Duft, Graziano & Forest,P.C.

(57) ABSTRACT

The precise solder paste application process makes use of mask registration apertures that are formed in the printed circuit board and that are adapted to receive a component solder paste mask that conforms to the conductor pattern of the component to be replaced. The component solder paste mask comprises a mask that has formed therein apertures that correspond to the pattern of solder paste that is to be applied to the printed circuit board surface mount pads to correspond to the conductors of the component. The component solder paste mask includes registration features that mate with the registration apertures formed in the printed circuit board to thereby ensure precise placement of the component solder paste mask over the area of the printed circuit board that receives the replacement component. The repair person can therefore simply and precisely place the component solder paste mask on the printed circuit board, apply the solder paste to the printed circuit surface mount pads exposed through the apertures formed in the component solder paste mask and thereby ensure that the pattern of solder paste precisely corresponds to the printed circuit board surface mount pads. This ensures that the component, when placed on the printed circuit board surface mount pads, can be soldered to these surface mount pads without solder overflow.

9 Claims, 1 Drawing Sheet

METHOD AND APPARATUS FOR PRECISELY REGISTERING SOLDER PASTE IN A PRINTED CIRCUIT BOARD REPAIR OPERATION

FIELD OF THE INVENTION

This invention relates to the repair of printed circuit boards and, in particular, to the precise application of solder paste to the surface mount pads of the printed circuit board that are to used to receive a replacement printed circuit board component.

PROBLEM

It is a problem in the field of printed circuit board repair to efficiently and accurately replace circuit elements on the printed circuit board, once the printed circuit board has been populated with components. In the manufacturing process, the bare (devoid of components) printed circuit board is overlaid with a global solder mask that contains a plurality of apertures that correspond to the component contacts. Once the global solder mask is in place on the printed circuit board, a layer of solder paste is applied to the global solder mask and thus also to the printed circuit board surface mount pads that are exposed through the mask apertures. The global solder mask is then removed and automated equipment is used to both position the numerous components that populate the printed circuit board and solder these components to the surface mount pads. However, once the printed circuit board is populated with components, the global solder mask can no longer be used to apply solder paste to desired surface mount pads during the replacement of a component due to the presence of the remaining components on the printed circuit board.

This is a problem in the case of surface mount devices, especially mini Ball Grid Array active devices and bare die circuit elements. This is due to the fact that these component packages are of small dimensions (typically 50*50 mils) and contain a large number of fine pitch conductors (typically 15 mil centers or less), which conductors are located under the device and can not be seen by the human eye. Therefore, the registration of the component conductors with the printed circuit board surface mount pads is critical and the interconnection of these elements is highly dependent upon the precise placement of solder paste on the surface mount pads of the printed circuit board. However, when one of these components needs to be replaced after the printed circuit board is manufactured, the failed component must be unsoldered, removed and the printed circuit board surface mount pads cleaned to receive the replacement component. As part of the replacement component installation process, the printed circuit board surface mount pads must be coated with solder paste. If the solder paste overprints or is misregistered on to the surface of the printed circuit board, the solder flow can bridge the space between adjacent component conductors under the component and short out the component. Therefore, the precise application of the solder paste to the printed circuit board surface mount pads is necessary and requires a tedious, labor intensive process, which has a high failure rate. Therefore, there is presently no process to efficiently and accurately apply solder paste to the printed circuit board surface mount pads to interconnect replacement components once the printed circuit board is manufactured.

SOLUTION

The above described problems are solved and a technical advance achieved in the field by the present process for precisely registering solder paste in a printed circuit board repair operation (termed "precise solder paste registration process" herein). The precise solder paste registration process entails the basic component removal steps of the prior art, coupled with a novel method of precisely applying solder paste to the printed circuit board surface mount pads. The precise solder paste application process makes use of mask registration apertures that are formed in the printed circuit board and that are adapted to receive a component solder paste mask that conforms to the conductor pattern of the component to be replaced. The component solder paste mask comprises a mask sized for the single component that is being replaced and that has formed therein apertures that correspond to the pattern of solder paste that is to be applied to the printed circuit board surface mount pads to correspond to the conductors of the component. The component solder paste mask includes registration features (such as tooling pins) that mate with the registration apertures (such as tooling holes) formed in the printed circuit board to thereby ensure precise placement of the component solder paste mask over the area of the printed circuit board that receives the replacement component. The repair person can therefore simply and precisely place the component solder paste mask on the printed circuit board, apply the solder paste to the printed circuit surface mount pads exposed through the apertures formed in the component solder paste mask and thereby ensure that the pattern of solder paste precisely corresponds to the printed circuit board surface mount pads. This ensures that the component, when placed on the printed circuit board surface mount pads, can be soldered to these surface mount pads without solder overflow. The component solder paste mask also optionally includes one or more gripping elements that protrude from the top surface of the component solder paste mask to enable the repair person to grasp and position the component solder paste mask. The one or more gripping elements can be extensions of the registration features. Furthermore, fasteners can be used to secure the registration features once they are placed in the mask registration apertures.

DETAILED DESCRIPTION

Figure 1:
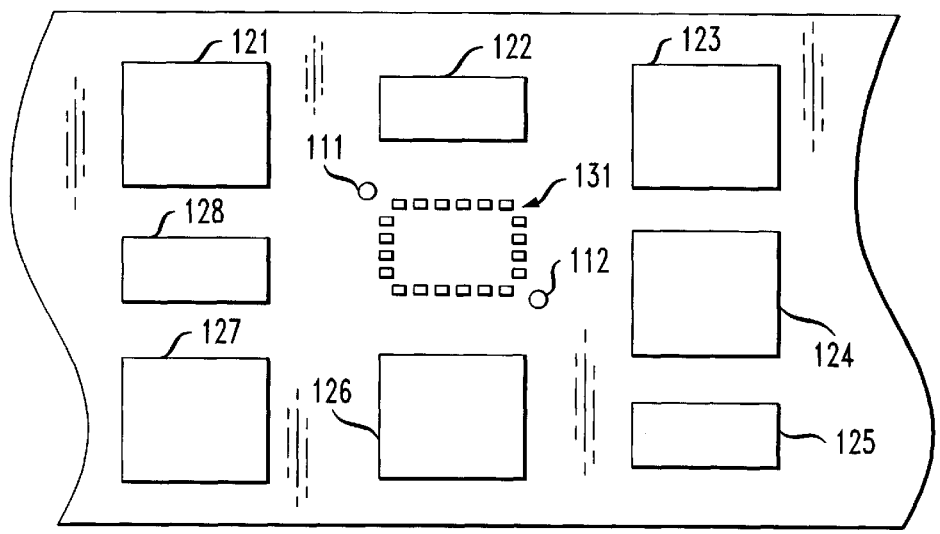
FIG. 1 illustrates a top plan view of a portion of a typical printed circuit board with a component removed therefrom to expose both the pattern of surface mount pads for the component and the component solder paste mask registration apertures formed in the printed circuit board.

The precise solder paste registration process entails the basic component removal steps of the prior art, coupled with a novel method of precisely applying solder paste to the printed circuit board surface mount pads. In particular, on a printed circuit board 100 as shown in FIG. 1, a plurality of components 121–128 are mounted on the printed circuit board 100 and connected to surface mount pads (not shown) that are formed on the top surface of the printed circuit board 100. When one of these components fails and needs to be replaced after the printed circuit board 100 is manufactured, the failed component must be unsoldered, removed from the printed circuit board 100 and the printed circuit board surface mount pads 131 for this component cleaned to receive the replacement component. FIG. 1 illustrates a top plan view of a portion of a typical printed circuit board 100 with a component removed therefrom to expose both the pattern of surface mount pads 131 for the component and the component solder paste mask registration apertures 111–112 formed in the printed circuit board 100. As part of the replacement component installation process, the printed circuit board surface mount pads 131 must be coated with solder paste. The component solder paste mask registration apertures 111–112 are located to ensure dimensional stability of the component solder paste mask 200 when placed in position. As shown in FIG. 1, the component solder paste mask registration apertures 111–112 can be placed at opposite corners of the rectangular shaped pattern of surface mount pads 131, located outside of the area bounded by the pattern of surface mount pads 131. Other configurations and quantities of component solder paste mask registration apertures 111–112 can be used for the same purpose and the particular configuration of component solder paste mask registration apertures 111–112 shown herein is for illustration purposes.

Figure 2:
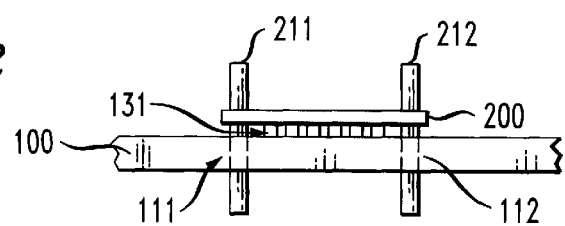
FIG. 2 illustrates a side cross-section view of the component solder paste mask applied to the printed circuit board of FIG. 1.
Figure 3:
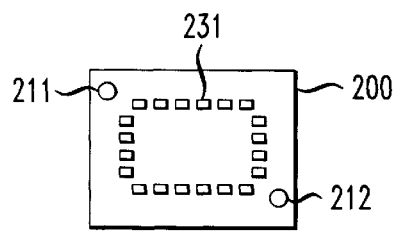
FIG. 3 illustrates a top plan view of the portion of a typical printed circuit board of FIG. 1 with the component solder paste mask applied thereon.

FIGS. 2 and 3 illustrate side and top views of the component solder paste mask 200 applied to the printed circuit board 100 of FIG. 1. The solder paste application process makes use of a plurality of mask registration apertures 111–112 formed in the printed circuit board 100 which are adapted to receive a component solder paste mask 200. The component solder paste mask 200 includes a plurality of apertures 231 formed therein that conform to the conductor pattern of the component to be replaced and therefore also correspond to the pattern the printed circuit board surface mount pads 131. The component solder paste mask 200 includes registration features 211, 212 that mate with the component solder paste mask registration apertures 111, 112 formed in the printed circuit board 100 to thereby ensure precise placement of the component solder paste mask 200 over the area of the printed circuit board 100 that receives the replacement component. The repair person can therefore simply and precisely place the component solder paste mask 200 on the printed circuit board 100, using the registration features 211, 212 of the component solder paste mask and the component solder paste mask registration apertures 111, 112 of the printed circuit board 200 to precisely align the component solder paste mask 200. The repair person can then apply the solder paste to the component solder paste mask 200 and thus also to the printed circuit board surface mount pads 131 that are exposed by the apertures 231 formed in the component solder paste mask 200. The component solder paste mask 200 ensures that the pattern of solder paste precisely corresponds to the printed circuit board surface mount pads 131. This ensures that the component, when placed on the printed circuit board surface mount pads 131, can be soldered to these surface mount pads 131 without solder overflow.

Figure 4:
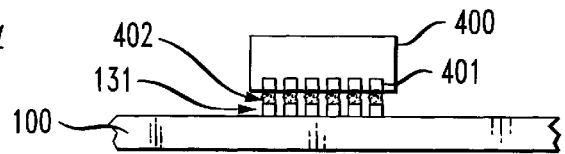
FIG. 4 illustrates a side cross-section view of the component placed on the printed circuit board surface mount pads prior to soldering.

FIG. 4 illustrates a side view of the component 400 placed on the printed circuit board surface mount pads 131 prior to soldering. Each conductor 401 on the component 400 is typically preloaded with a solder ball 402 that is used to electrically interconnect the conductor 401 with a corresponding surface mount pad 131 on the printed circuit board 100. Thus, the heating of the solder balls 402 on the component 400 causes the solder to flow and interconnect, both mechanically and electrically, the component conductors 401 with the printed circuit board surface mount pads 131.

The registration features 211, 212 can either be integral elements of the component solder paste mask 200 or can be elements that are insertable therein. In addition, the registration features 211, 212 can not only include a first section that extends from a first surface (bottom) of the component solder paste mask 200 to mate with the component solder paste mask registration apertures 111,112, but can include a second section that extends from a second surface (top) of the component solder paste mask 200 to thereby provide the repair person with a protrusion that can be gripped to enable positioning of the component solder paste mask 200 by the repair person. In addition, the component solder paste registration apertures 111,112 can extend through the printed circuit board 100 so that when the registration features 211,212 are inserted into the component solder paste registration apertures 111,112, a fastener can be attached to the ends of the registration features 211, 212 that protrude from the bottom.of the printed circuit board 100.

SUMMARY

The component solder paste mask comprises a mask sized for the single component that is being replaced and that has formed therein apertures that correspond to the pattern of solder paste that is to be applied to the printed circuit board surface mount pads to correspond to the conductors of the component. The component solder paste mask includes registration features that mate with the registration apertures formed in the printed circuit board to thereby ensure precise placement of the component solder paste mask over the area of the printed circuit board that receives the replacement component.

What is claimed:

1. Apparatus for enabling the replacement of a component on a printed circuit board which is equipped with a plurality of components, each of which is mounted thereon in a corresponding component mounting site, said apparatus facilitating the precise application of solder paste to a selected one of said plurality of component mounting sites, which selected component mounting site comprises a plurality of surface mount pads that are formed in a predetermined pattern on said printed circuit board to receive a component whose conductors correspond to said predetermined pattern of surface mount pads, comprising:

a plurality of component solder paste mask registration apertures formed in said printed circuit board and located juxtaposed to said predetermined pattern of surface mount pads, which comprises said selected component mounting site;

component solder paste mask means having a plurality of apertures formed therein that correspond exclusively to said predetermined pattern of surface mount pads which comprises said selected component mounting site; and mask registration means formed on said component solder paste mask means for insertion into said plurality of component solder paste mask registration apertures to secure said component solder paste mask means in position with respect to said plurality of surface mount pads formed in said predetermined pattern on said printed circuit board, which comprises said selected component mounting site, to align said plurality of apertures formed in said component solder paste mask means exclusively with said plurality of surface mount pads formed in said predetermined pattern on said printed circuit board, which comprises said selected component mounting site, to enable the application of solder paste exclusively to said plurality of surface mount pads via said plurality of apertures formed in said component solder paste mask means, wherein said mask registration means comprises:

a plurality of mask registration features, each of which comprises:

first section extending from a first surface of said component solder paste mask means for insertion into a corresponding one of said plurality of component solder paste mask registration apertures; and a second section extending from a second surface of said component solder paste mask means for providing a grip for a user.

2. The apparatus for use in precisely applying solder paste to a component mounting site of claim 1 wherein said mask registration means is fixedly connected to said component solder paste mask means.

3. The apparatus for use in precisely applying solder paste to a component mounting site of claim 1 further comprising:

means for securing each of said mask registration means when inserted into corresponding ones of said plurality of component solder paste mask registration apertures.

4. The apparatus for use in precisely applying solder paste to a component mounting site of claim 1 wherein said plurality of component solder paste mask registration apertures comprises:

first and second holes formed in said printed circuit board, located on opposite sides of said predetermined pattern of said plurality of surface mount pads formed on said printed circuit board.

5. The apparatus for use in precisely applying solder paste to a component mounting site of claim 4, wherein said first and second holes extend through the entirety of said printed circuit board, further comprising:

means for securing an end of each of said mask registration means, when inserted into corresponding ones of said first and second holes, that protrudes through said printed circuit board.

6. Apparatus for enabling the replacement of a component on a printed circuit board which is equipped with a plurality of components, each of which is mounted thereon in a corresponding component mounting site, said apparatus facilitating the precise application of solder paste to a selected one of said plurality of component mounting sites, which selected component mounting site comprises a plurality of surface mount pads that are formed in a predetermined pattern on said printed circuit board to receive a component whose conductors correspond to said predetermined pattern of surface mount pads, comprising:

a plurality of component solder paste mask registration apertures formed in said printed circuit board and located juxtaposed to said predetermined pattern of surface mount pads, which comprises said selected component mounting site;

component solder paste mask means comprising:

a plate having a substantially planar surface with a plurality of apertures formed therein that correspond exclusively to said predetermined pattern of surface mount pads which comprises said selected component mounting site; and mask registration means affixed to said plate and extending in a first direction therefrom for insertion into said plurality of component solder paste mask registration apertures to secure said component solder paste mask means in position with respect to said plurality of surface mount pads formed in said predetermined pattern on said printed circuit board, which comprises said selected component mounting site, to align said plurality of apertures formed in said component solder paste mask means exclusively with said plurality of surface mount pads formed in said predetermined pattern on said printed circuit board, which comprises said selected component mounting site, to enable the application of solder paste exclusively to said plurality of surface mount pads via said plurality of apertures formed in said component solder paste mask means, and a second section extending from a second surface of said component solder paste mask means for providing a grip for a user.

7. The apparatus for use in precisely applying solder paste to a component mounting site of claim 6 further comprising:

means for securing each of said mask registration means when inserted into corresponding ones of said plurality of component solder paste mask registration apertures.

8. The apparatus for use in precisely applying solder paste to a component mounting site of claim 6 wherein said plurality of component solder paste mask registration apertures comprises:

first and second holes formed in said printed circuit board, located on opposite sides of said predetermined pattern of said plurality of surface mount pads formed on said printed circuit board.

9. The apparatus for use in precisely applying solder paste to a component mounting site of claim 8, wherein said first and second holes extend through the entirety of said printed circuit board, further comprising:

means for securing an end of each of said mask registration means, when inserted into corresponding ones of said first and second holes, that protrudes through said printed circuit board.

\* \* \* \* \*

UNITED STATES PATENT AND TRADEMARK OFFICE
CERTIFICATE OF CORRECTION

PATENT NO.    : 6,182,883 B1
DATED         : February 6, 2000
INVENTOR(S)   : Kingsley et al.

Page 1 of 1

It is certified that error appears in the above-identified patent and that said Letters Patent is hereby corrected as shown below:

Claim 13, column 11,
Line 5, "claim 49" should read, -- claim 12;

Claim 14, column 11,
Line 8, "claim 50" should read, -- claim 13 --.

Signed and Sealed this

Thirtieth Day of October, 2001

Attest:

*Attesting Officer*

NICHOLAS P. GODICI
*Acting Director of the United States Patent and Trademark Office*